United States Patent [19]
Omote et al.

[11] Patent Number: 5,858,518
[45] Date of Patent: Jan. 12, 1999

[54] CIRCUIT SUBSTRATE, CIRCUIT-FORMED SUSPENSION SUBSTRATE, AND PRODUCTION METHOD THEREOF

[75] Inventors: Toshihiko Omote; Yasuhito Funada, both of Osaka, Japan

[73] Assignee: Nitto Denko Corporation, Osaka, Japan

[21] Appl. No.: 799,930

[22] Filed: Feb. 13, 1997

[30] Foreign Application Priority Data

| | | | |
|---|---|---|---|
| Feb. 13, 1996 | [JP] | Japan | 8-025616 |
| Apr. 22, 1996 | [JP] | Japan | 8-100253 |
| Jan. 22, 1997 | [JP] | Japan | 9-009298 |

[51] Int. Cl.⁶ .................................................. B32B 27/18
[52] U.S. Cl. ........................... 428/209; 428/323; 428/458; 428/901
[58] Field of Search ..................... 428/209, 323, 428/458, 901; 528/353

[56] References Cited

U.S. PATENT DOCUMENTS

| | | | |
|---|---|---|---|
| 5,470,943 | 11/1995 | Sakata et al. | 528/353 |
| 5,605,763 | 2/1997 | Yusa et al. | 428/209 |
| 5,665,802 | 9/1997 | Maki et al. | 524/141 |

FOREIGN PATENT DOCUMENTS

| | | |
|---|---|---|
| A-4-47933 | 2/1992 | Japan . |
| 04096374 | 4/1992 | Japan . |
| 06241284 | 10/1994 | Japan . |

*Primary Examiner*—John M. Cooney, Jr.
*Attorney, Agent, or Firm*—Sughrue, Mion, Zinn, Macpeak & Seas, PLLC

[57] ABSTRACT

A circuit substrate having an insulating layer comprising a polyimide resin on a metal foil substrate, wherein the polyimide resin is a polyimide resin obtained by the reaction of (A) aromatic diamines comprising
  (a) 1,3-bis(4-aminophenoxy)benzene and
  (b) 2,2'-bis(trifluoromethyl)-4,4'-diaminobiphenyl
and
(B) aromatic tetracarboxylic acid dianhydrides comprising
  (a) 3,4,3',4'-biphenyltetracarboxylic acid dianhydride and
  (b) 2,2-bis(3,4-dicarboxyphenyl)hexafluoropropane dianhydride.

The circuit-formed substrate has a desired circuit comprising a conductive layer on the circuit substrate.

The polyimide resin has a low hygroscopic property and thus the substrate is excellent in the dimensional stability and does not cause warping even when the humidity in the environmental atmosphere is changed.

22 Claims, 6 Drawing Sheets

CIRCUIT SUBSTRATE, CIRCUIT-FORMED SUSPENSION SUBSTRATE, AND PRODUCTION METHOD THEREOF

FIELD OF THE INVENTION

The present invention relates to a circuit substrate, a circuit-formed suspension substrate, and production methods of them. More specifically, the present invention relates a circuit substrate having an insulating layer comprising a polyimide resin on a metal foil substrate, a circuit-formed suspension substrate having formed on the circuit substrate a pattern circuit comprising a conductive layer, and production methods of them.

In a magnetic disk device such as a hard disk device which is used as an external storage device for a computer, etc., for performing magnetic recording or regeneration, it is necessary to relatively run the above-described magnetic disk and a magnetic head, elastically push the magnetic head to the magnetic disk against to an air stream formed thereby, and keep a definite fine interval between the magnetic head and the magnetic disk. A magnetic head supporting means for elastically pushing the magnetic head to the magnetic disk against the air stream as described above is a suspension. The present invention relates to a circuit substrate which can be suitably used for producing such a circuit-formed suspension device, a circuit-formed suspension substrate having formed on such a circuit substrate a circuit comprising a conductive layer by a patterning technique, and the production methods of them.

BACKGROUND OF THE INVENTION

Recently, a circuit substrate comprising a metal foil having formed thereon an insulating layer comprising a polyimide resin has been used as a thin-film multilayer circuit substrate for the purposes of high-density packaging of semiconductors and a high-speed signal treatment. However, in such a conventional circuit substrate, since the polyimide resin has a large hygroscopic property, the circuit substrate is liable to cause a dimensional change and warping by the change of the humidity in the environmental atmosphere.

On the other hand, in computers and storage devices which are peripheral equipments for computers, in addition to the improvement of the capacity, small-sizing and a low cost have been required and with such requirements for a background, in particular, the technique of hard disk drives has been greatly advanced. Also, in the magnetic head, recently the developments of a thin-film magnetic head (TFH) wherein the coil portion is made of a thin film and further a thin film-magnetic resistance composite head (MR) which serves reading and writing and has a greatly large storage capacity have been hurried to a conventional metal in gap (MIG).

However, by a conventional technique of constituting desired wiring by laying a conductive wire on a suspension substrate, the conductive wire gives influences on the elastic modulus of the suspension to cause the fluctuation of the pushing force of the suspension and as the case may be, by the contact with the magnetic disk, the durability of the magnetic disk device is sometimes lowered.

Therefore, recently, a suspension formed by directly forming an electric circuit on a suspension substrate for mounting a magnetic head has been practically used. However, in such a suspension, when a dimensional change and warping occur on the circuit substrate by the change of the humidity in the environmental atmosphere, the inferior performance sometimes occurs.

SUMMARY OF THE INVENTION

The present invention has been made to overcome the above-described problems in the conventional circuit substrate comprising a metal foil having formed thereon an insulating layer comprising a polyimide resin and in the circuit-formed suspension substrate prepared by using the circuit substrate.

Accordingly, one object of the present invention is to provide a circuit substrate wherein the polyimide resin used has a low hygroscopic property and hence even when the humidity in the environmental atmosphere is changed, the dimensional change and warping scarcely occur.

Another object of the present invention is to provide a circuit-formed suspension substrate using the circuit substrate.

Further object of the present invention is to provide the production methods of them.

According to a first embodiment of the present invention, there is provided a circuit substrate comprising a metal foil substrate and an insulating layer comprising a polyimide resin formed on the metal foil substrate, wherein the polyimide resin is a polyimide resin obtained by the reaction of (A) aromatic diamines comprising
    (a) 1,3-bis(4-aminophenoxy)benzene and
    (b) 2,2'-bis(trifluoromethyl)-4,4'-diaminophenyl
and
(B) aromatic tetracarboxylic acid dianhydrides comprising
    (a) 3,4,3',4'-biphenyltetracarboxylic acid dianhydride
and
    (b) 2,2-bis(3,4-dicarboxyphenyl)hexafluoropropane dianhydride.

According to a second embodiment of the present invention, there is provided a method of producing a circuit substrate having an insulating layer comprising a polyimide resin by forming a coating film comprising a photosensitive polyimide resin precursor on a metal foil substrate, light-exposing the coating film, heating the film after the light-exposure, developing, and heating the film to imidate the precursor, wherein the photosensitive polyimide resin precursor is obtained by compounding a polyamic acid obtained by the reaction of (A) aromatic diamines comprising
    (a) 1,3-bis(4-aminophenoxy)benzene and
    (b) 2,2'-bis(trifluoromethyl)-4,4'-diaminophenyl
and
(B) aromatic tetracarboxylic acid dianhydrides comprising
    (a) 3,4,3',4'-biphenyltetracarboxylic acid dianhydride
and
    (b) 2,2-bis(3,4-dicarboxyphenyl)hexafluoropropane dianhydride with a photosensitive agent.

According to the method described above, by light-exposing the coating film comprising the photosensitive polyimide resin precursor formed on the metal foil substrate in conformity with a definite pattern, heating the film after light-exposure, developing the film to form the definite pattern comprising the above-described precursor, and finally heating the pattern-formed film at high temperature to form polyimide, the circuit substrate having the patterned insulating layer comprising the polyimide resin can be obtained.

According to a third embodiment of the present invention, there is provided a circuit-formed suspension substrate comprising a metal foil substrate, an insulating layer comprising a polyimide resin formed on the metal foil substrate, and a pattern circuit comprising a conductive layer formed on the insulating layer, wherein the polyimide resin is a polyimide resin obtained by the reaction of the aromatic diamines and the tetracarboxylic acid dianhydrides described above.

Also, according to a fourth embodiment of the present invention, there is provided a method of producing a circuit-formed suspension substrate obtained by forming a pattern circuit comprising a conductor layer on the insulating layer comprising the polyimide resin of the circuit substrate described above, wherein the photosensitive polyimide resin precursor for forming the insulating layer of the circuit substrate is obtained by compounding the polyamic acid obtained by the reaction of the aromatic diamines and the tetracarboxylic acid dianhydrides described above with a photosensitive agent.

According to this method, by forming the above-described circuit substrate having the definite-patterned insulating layer comprising the polyimide resin and then forming a pattern-circuit comprising a conductive layer on the insulating layer, the circuit-formed suspension substrate is obtained.

DETAILED DESCRIPTION OF THE INVENTION

Figure 1:
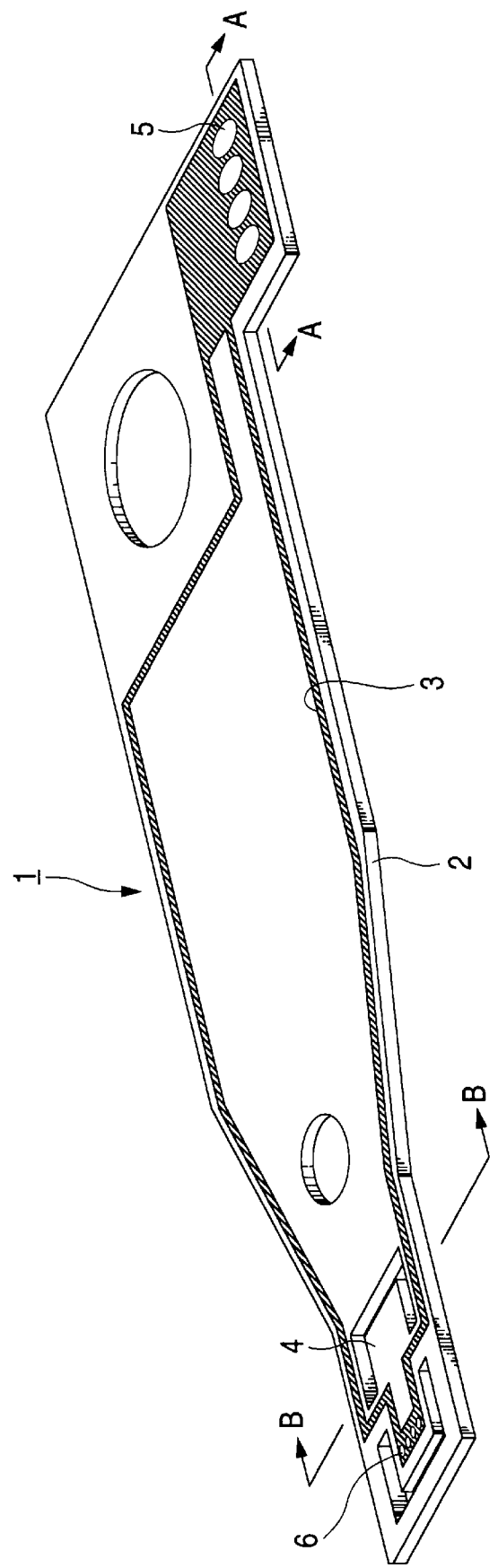
FIG. 1 is a slant view showing an example of the circuit-formed suspension substrate of the present invention.

The present invention is described in detail below.

According to the present invention, in the circuit substrate comprising a metal foil substrate and an insulating layer comprising a polyimide resin formed on the metal foil substrate, the polyimide resin is a polyimide resin obtained by the reaction of (A) aromatic diamines comprising
(a) 1,3-bis(4-aminophenoxy)benzene

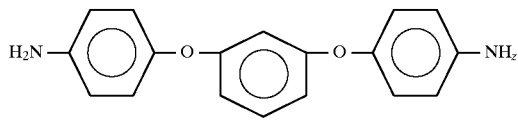

and
(b) 2,2'-bis(trifluoromethyl)-4,4'-diaminobiphenyl

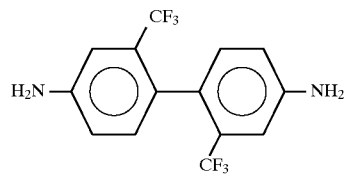

and
(B) aromatic tetracarboxylic acid dianhydrides comprising (a) 3,4,3',4'-biphenyltetracarboxylic acid dianhydride

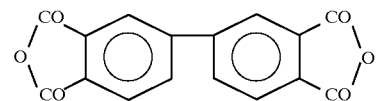

and
(b) 2,2'-bis(3,4-dicarboxypheny)hexafluoropropane dihydride.

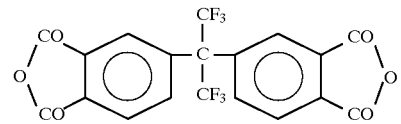

In the present invention, there is no particular restriction on the metal foil substrate, but usually a stainless steel foil, a copper foil, an aluminum foil, a copper-beryllium foil, a phosphor bronze foil, a 42 alloy foil, etc., are used. Furthermore, according to the present invention, a long metal foil is preferably used as such a metal foil substrate. That is, each insulating layer comprising the polyimide resin is formed on the long metal foil substrate in such a manner of repeatedly applying a definite patten, each desired patten circuit comprising the conductive layer is formed on each patterned insulating layer, and finally, the long metal foil substrate is cut every each pattern circuit to provide each pattern-formed suspension substrate.

Thus, according to the present invention, the circuit substrate can be obtained by coating a solution of the photosensitive polyimide resin precursor on a long metal foil substrate such as a long stainless steel foil followed by drying to form a coating film, exposing the coating film to ultraviolet rays via a mask having a definite pattern, heating (heating after light exposure), developing, and then applying heat-curing (polyimidation of the polyamic acid) to form a definite pattern comprising the polyimide resin as the insulating layer.

The above-described photosensitive polyimide resin precursor is a liquid composition obtained by reacting the aromatic diamines and the aromatic tetracarboxylic acid dianhydrides described above at a substantially equimolar ratio in an appropriate organic solvent such as N-methyl-2-pyrrolidone, dimethyl acetamide, etc., to form polyamic acid, and compounding the polyamic acid with a photosensitive agent.

According to the present invention, in the aromatic diamines described above, the proportion of 1,3-bis(4-aminophenoxy)benzene is in the range of from 40 to 60 mol %, and preferably from 45 to 55 mol %, and the proportion of 2,2'-bis (trifluoromethyl)-4,4'-diaminobiphenyl is in the range of from 60 to 40 mol %, and preferably from 55 to 45 mol %. Also, in the aromatic tetracarboxylic acid dianhydrides described above, the proportion of 3,4,4',4'-biphenyltetracarboxylic acid dianhydride is in the range of from 40 to 60 mol %, and preferably from 45 to 55 mol %, and the proportion of 2,2-bis(3,4-dicarboxyphenyl) hexafluoropropane is in the range of from 60 to 40 mol %, and preferably from 55 to 45 mol %.

According to the present invention, by using such two kinds of the aromatic diamines and two kinds of the aromatic tetracarboxylic acid dianhydrides in such proportions, a polyimide resin having a low hygroscopic property can be obtained.

Moreover, according to the present invention, in the aromatic diamines, 1,3-bis(4-aminophenoxy)benzene has the functions of making the polyimide resin obtained transparent to ultraviolet rays, making the photosensitive polyimide resin precursor containing a photosensitive agent high-sensitive to ultraviolet rays, and making large the difference of the dissolution speeds of the light-exposed portions and the non-exposed portions in a developer when light-exposing the photosensitive polyimide resin precursor, heating, and developing, to give images of a high contrast, whereby it becomes possible to perform precise patterning work.

On the other hand, in the aromatic diamines, since 2,2'-bis(trifluoromethyl)-4,4'-diaminobiphenyl increases the developing speed of the non-exposed portions, a developing solution having a low alkali concentration can be used and also the developing temperature can be lowered. Furthermore, it is not necessary to add an alcohol to the developing solution, which increases the safety at development.

As the photosensitive agent described above, the dihydropyridine derivative represented by formula (I)

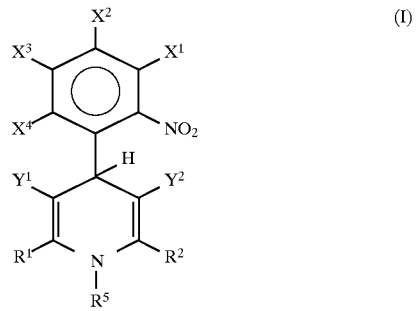

(I)

wherein, $X^1$, $X^2$, $X^3$, and $X^4$ each independently represent a hydrogen atom, a fluorine atom, a nitro group, a methoxy group, an amino group, a dialkylamino group, a cyano group, or a fluorinated alkyl group; $Y^1$ represents a cyano group or a group represented by formula —$COR^3$, $Y^2$ represents a cyano group or a group represented by formula —$COR^4$ (wherein $R^3$ and $R^4$ each independently represent an alkyl group having from 1 to 4 carbon atoms, an anilino group, a toluidino group, a benzyloxy group, an amino group, or a dialkylamino group); $R^1$, $R^2$, and $R^5$ each independently represent a hydrogen atom or an alkyl group having from 1 to 3 carbon atoms; and the R and $R^3$ and the $R^2$ and $R^4$ each can form a ring capable of forming a 5-membered ring, a 6-membered ring, or a heterocyclic group each containing a keto group, as described in detail in JP-A-6-75376 (the term "JP-A" as used herein means an "unexamined published Japanese patent application") can be used.

Examples of the photosensitive agent include 4-o-nitrophenyl-3,5-dimethoxycarbonyl-2,6-dimethyl-1,4-dihydropyridine (hereinafter referred to as "niphedipin"), 4-o-nitrophenyl-3,5-dimethoxycarbonyl-2,6-dimethyl-1-methyl-4-hydropyridine (hereinafter referred to as "N-methyl compound"), and 4-o-nitrophenyl-3,5-diacetyl-1,4-dihydropyridine (hereinafter referred to as "acetyl compound"). Those can be used alone or as mixtures thereof.

If necessary, an appropriate amount of imidazole is used as a dissolution aid to a developer.

In the present invention, the dihydropyridine derivative described above is usually used in the range of from 0.05 to 0.5 molar part to 1 molar part of the total amount of the aromatic diamines and the aromatic tetracarboxylic dianhydrides. Imidazole which is used, if necessary, is usually used in the range of from 0.05 to 0.5 molar part to 1 molar part of the total amount of the aromatic diamines and the aromatic tetracarboxylic acid dianhydrides.

By coating a solution of the photosensitive polyimide resin precursor on an appropriate substrate, light-exposing (ultraviolet irradiation) the coating film by irradiating the film with ultraviolet rays, and heating (heating after light-exposure), positive-type or negative-type latent images are formed. By developing the latent images, positive-type or negative-type images, that is, the desired patterns, are obtained. Thus, by finally heating the patterns at high temperature to imidate the polyamic acid, a patterned coating film comprising the polyimide resin can be obtained.

In more detail, in the case of using the photo-sensitive imide resin precursor described above, when the heating temperature after light-exposure is relatively low as about 140° C., the exposed portions are dissolved in a developer to form a positive-type image, while when the heating temperature after light-exposure is relative high as higher than about 170° C., the non-exposed portions are dissolved in a developer to form a negative image, although the above-described condition may differ a little according to the kind of the photosensitive agent used.

In this case, as the developer described above, an aqueous solution of an organic alkali such as tetraethylammonium hydroxide, etc., or an aqueous solution of an inorganic alkali such as sodium hydroxide, potassium hydroxide, etc., is used. The alkali concentration is usually in the range of from 2 to 5% by weight. To the aqueous alkali solution may be added a lower aliphatic alcohol such as methanol, ethanol, n-propanol, iso-propanol, etc. The amount of the alcohol added is usually 50% by weight or lower. Also, the developing temperature is usually in the range of from 25° to 50° C.

In the case of using the photosensitive polyimide resin precursor for use in the present invention, when the heating temperature after light-exposure is relatively low as about 140° C., in the non-exposed portions, a hydrogen bond is formed between the imino group hydrogen at the 1-position of the dihydropyridine derivative and the carboxy group of the polyamic acid to decrease the hydrophilic property of the polyimide resin and the diffusion speed of the coated layer into the developer, which results in lowering the dissolution speed of the coated layer into the developer, while in the exposed portions, the dihydropyridine derivative which is a neutral compound is changed to a basic pyridine compound by the light-exposure, and the basic pyridine compound forms polyamic acid and a weak salt structure, which results in increasing the hydrophilic property of the coated layer to increase the dissolution speed of the coated layer into the developer. As described above, since, in this case, the dissolution speed of the exposed portions in the developer is larger than that of the non-exposed portions, the coating film after light-exposure, heating after light-exposure, and developing gives a positive-type image.

On the other hand, in the case of using the photosensitive polyimide resin precursor used in the present invention, when the heating temperature after light-exposure is relatively high as higher than 170° C., in the non-exposed portions, the dissolution speed of the coated layer in the developer is lowered as the case that the heating temperature after light-exposure is relatively low as about 140° C., while in the exposed portions, the dihydropyridine derivative described above is changed to a basic pyridine compound by the light-exposure, the basic pyridine compound accelerates the polyimidation of polyamic acid to lower the dissolution speed of the coating film in the developer and at the same time, the pyridine compound itself is further changed to an insoluble cyclic compound by heating after light-exposure as well as accelerates the polyimidation of polyamic acid, which results in more lowering the solubility of the coating film at the exposed portions in the developer as compared with the non-exposed portions. As described above, when the heating temperature after light-exposure is relatively high as higher than about 170° C., since the dissolution speed of the exposed portions in the developer is greatly lower than that of the non-exposed portions, the coating film after light-exposure, heating after light-exposure, and developing gives a negative image.

According to the present invention, by coating a solution of the photosensitive polyimide resin precursor as described above on a long metal foil substrate followed by heat-drying to form a coating film of the precursor, light-exposing the coating film to a definite pattern by irradiating with ultraviolet rays through a mask, heating the film after light-exposure, developing to form, preferably, a negative image having the definite pattern, and then heat-curing the negative image to cause an imidation reaction to form an insulating layer comprising the polyimide resin, the circuit substrate of the present invention can be obtained.

For forming the polyimide resin by heating the polyimide resin precursor as described above, it is preferred to heat the coating film thereof for several hours at a temperature of from about 350° to 400° C. in vacuo or in an inert gas atmosphere.

Thereafter, by forming each definite circuit comprising a conductive layer having a definite pattern on the insulating layer by a conventional method and also forming necessary terminals, and then chemically cutting the long metal foil substrate into a desired form, the circuit-formed suspension substrate of the present invention can be obtained.

In the present invention, for improving the adhesive property of the polyimide resin obtained to the substrate, if necessary, an amino group-containing bifunctional polysiloxane may be used as a part of the diamine components. Examples of such an amino group-containing polysiloxane are polysiloxanes represented by following formula (II);

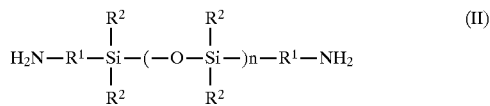

(II)

wherein $R^1$ represents an alkylene group having from 1 to 18 carbon atoms; $R^2$ represents an alkyl group having from 1 to 18 carbon atoms; and n represents an integer of from 1 to 100.

Such an amino group-containing bifunctional polysiloxane is used in the range of 10 mol % or less of the diamine component.

In particular, in the formula (II) described above, $R^1$ is preferably an alkylene group having from 1 to 7 carbon atoms and examples thereof are methylene, ethylene, propylene, butylene, and hexylene. $R^2$ is preferably an alkyl group having from 1 to 7 carbon atoms, and examples thereof are methyl, ethyl, propyl, butyl, and hexyl. Also, n is preferably an integer of from 1 to 40.

Bis(aminopropyl)tetramethyldisiloxane is preferably used as the amino group-containing bifunctional polysiloxane The circuit-formed suspension substrate of the present invention can be obtained as follows. After producing the circuit substrate as described above, by forming each pattern circuit comprising a conductive layer on the insulating layer comprising the polyimide resin according to a conventional method of a patterning technique and also forming necessary terminals, and then chemically cutting the insulating layer into a desired form, each circuit-formed suspension substrate can be obtained.

As described above, since according to the present invention, the circuit-formed suspension substrate of the present invention is obtained by applying a necessary work to the circuit substrate having the insulating layer comprising the polyimide resin having a low hygroscopic property as described above, such a suspension substrate causes very less dimensional change and warping by the change of the humidity in the environmental atmosphere. Thus, in a magnetic disk device such as a hard disk device, etc., using the circuit-formed suspension substrate of the present invention, when magnetic recording and regeneration are carried out, an inferior performance does not occur.

Furthermore, according to the present invention, since a precise patterning work can be applied at a high sensitivity and a high contrast, capacity increasing and small-sizing of the circuit-formed suspension substrate are possible.

The circuit-formed suspension substrate of the present invention and the production thereof are explained in detail by referring to the accompanying drawings.

FIG. 1 is a slant view showing an example of a circuit-formed suspension substrate 1 of the present invention. As shown in FIG. 1, the circuit-formed suspension substrate 1 has an insulating layer (not shown) comprising the polyimide resin on a stainless steel foil substrate 2 and a definite pattern circuit comprising a conductive layer 3 is formed thereon as a thin layer. At the tip portion of the substrate is formed a gimbal 4 in a body by forming cuts in the substrate and a slider (not shown) having a magnetic head is fixed onto it. At both end portions of the substrate are formed necessary terminals 5 and 6, respectively. FIG. 1 shows the state that a cover layer for protecting the surface of the substrate is released.

Figure 2:
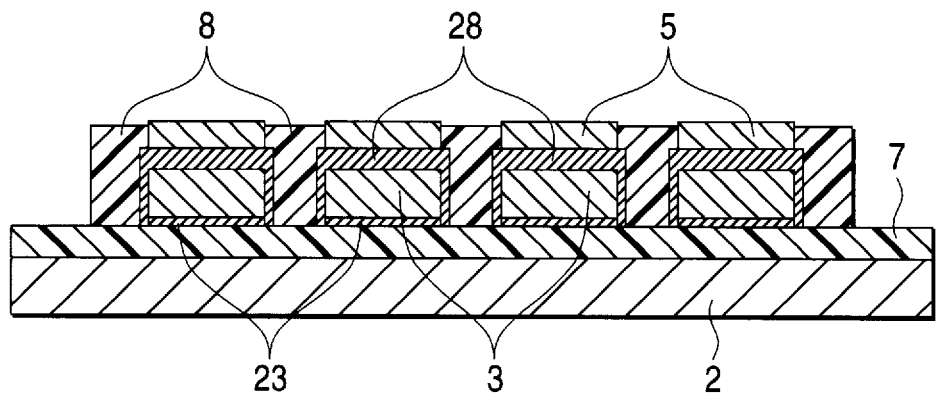
FIG. 2 is a cross-sectional view taken along line A—A of the circuit-formed suspension substrate shown in FIG. 1.

FIG. 2 is a cross-sectional view taken along line A—A in FIG. 1. The circuit-formed suspension substrate has an insulating layer 7 comprising the polyimide resin on a stainless steel foil substrate 2 and a definite pattern circuit comprising a copper conductive layer 3 is formed thereon as a thin layer via a chromium thin layer 23. The conductive layer is protected with a coating comprising a nickel thin layer 28 and further terminals 5 each are formed thereon. The whole surface excluding the terminals are protected with a coating film 8.

Figure 3:
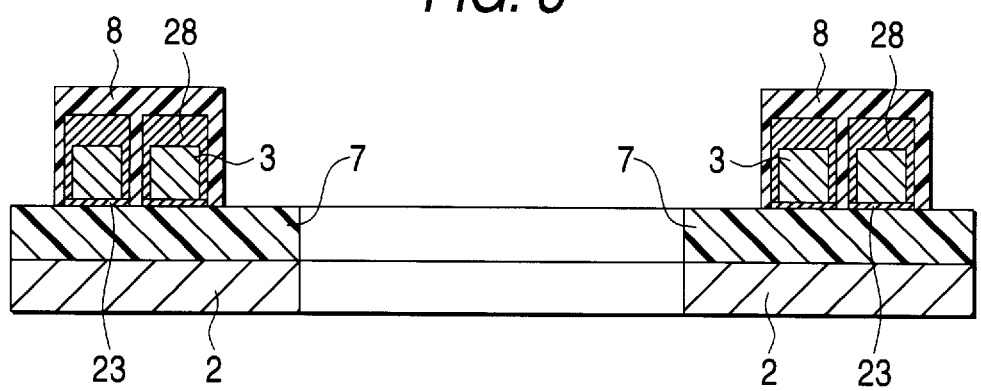
FIG. 3 is a cross-sectional view taken along line B—B of the circuit-formed suspension substrate shown in FIG. 1, FIG. 4, FIG. 5, FIG. 6, FIG. 7, FIG. 8, FIG. 9, FIG. 10, FIG. 11, FIG. 12, FIG. 13, FIG. 14, FIG. 15, and FIG. 16 are sectional views of main portions for showing the production steps of the circuit-formed suspension substrate of the present invention.

FIG. 3 is a cross-sectional view taken along line B—B in FIG. 1. The circuit-formed suspension substrate has an insulating layer 7 comprising the polyimide resin on the stainless steel foil substrate 2 and a definite pattern circuit comprising the copper conductor layer 3 is formed thereon via a chromium thin layer 23. The conductive layer is protected with a coating comprising a nickel thin layer 28 and further protected by a coating film 8.

As the long stainless steel foil substrate, the substrate having the thickness in the range of usually from 10 to 60 μm, and preferably from 15 to 30 μm, from the view point of the vibration characteristics, and the width in the range of from 50 to 500 mm, and preferably from 125 to 300 mm, is used. However, the long stainless steel foil substrate used in the present invention is not limited to them.

Figure 4:
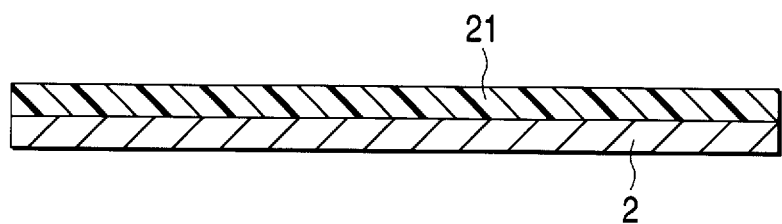
Figure 5:
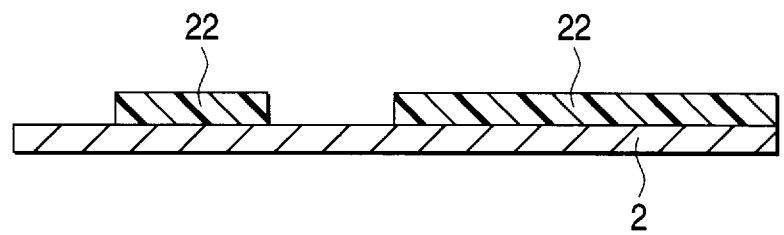

FIG. 4 and FIG. 5 show an embodiment of the production steps of the circuit substrate of the present invention, and FIG. 6 to FIG. 16 show an embodiment of the production steps of the circuit-formed suspension substrate of the present invention.

First, as shown in FIG. 4, a solution of the photosensitive polyimide resin precursor is coated on the entire surface of the stainless steel foil substrate as described above such that the thickness of the resin layer obtained is from 2 to 20 μm, and preferably from 5 to 10 μm, and the coating layer is heated at a temperature of from 60° to 150° C., and preferably from 80° to 120° C., to form a coating 21 of the photosensitive polyimide resin precursor.

The coating of the photosensitive polyimide resin precursor is irradiated with ultraviolet rays via a appropriate mask, whereby the coating is light-exposed to an definite pattern. In this case, the integrated light-exposure amount is in the range of usually from 100 to 1,000 mJ/cm$^2$, and preferably from 200 to 700 mJ/cm$^2$. The light-exposure wavelength is in the range of usually from 300 to 450 nm, and preferably from 350 to 420 nm. After the light exposure, the coating is heated (heating after light-exposure) at a temperature of from 80° to 200° C., and preferably from 120° to 180° C. for from about 2 to 10 minutes, and then subjected to a developing treatment. In the present invention, it is preferred to obtain negative images. The patterned coating of the polyimide resin precursor thus obtained is heated at high temperature to form a polyimide resin, whereby a patterned insulating layer 22 comprising the polyimide resin is formed on the stainless steel foil substrate 2 as shown in FIG. 5 to provide the circuit substrate of the present invention.

Figure 6:
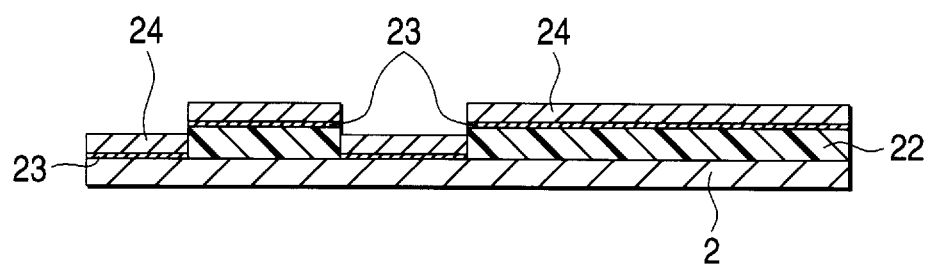

As shown in FIG. 6, a chromium thin layer 23 and a copper thin layer 24 are continuously and successively formed on the entire surface of the stainless steel foil substrate 2 having the patterned insulating layer 22 of the polyimide resin by sputtering. The existence of the chromium thin layer 22 is useful for closely adhering the copper thin layer 24 onto the insulating layer 22 comprising the polyimide resin. In this case, the thickness of the chromium thin layer is in the range of preferably from 100 to 800 Å, and the thickness of the copper thin layer is in the range of preferably from 500 to 2,000 Å. Also, the surface resistance of the copper thin layer thus obtained is usually 0.6 Ω/□ or less.

Figure 7:
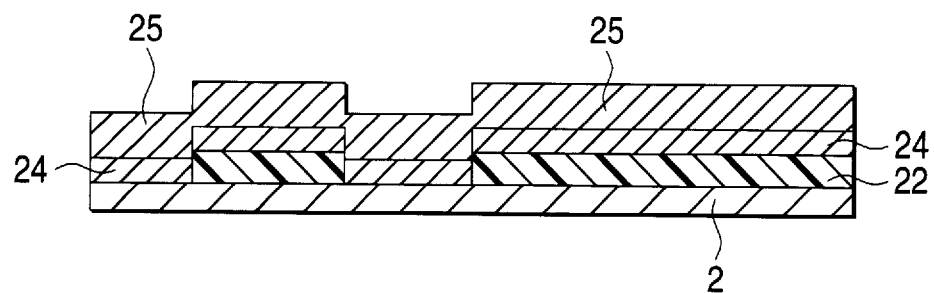

Thereafter, as shown in FIG. 7, electrolytic copper plating having a thickness of from about 2 to 15 μm is applied to the copper thin layer 24 to form a conductive layer 25 comprising copper. In FIG. 7, the chromium thin layer is not shown.

Figure 8:
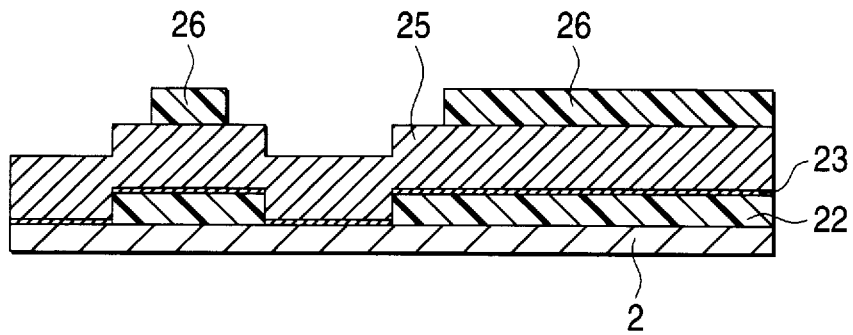
Figure 9:
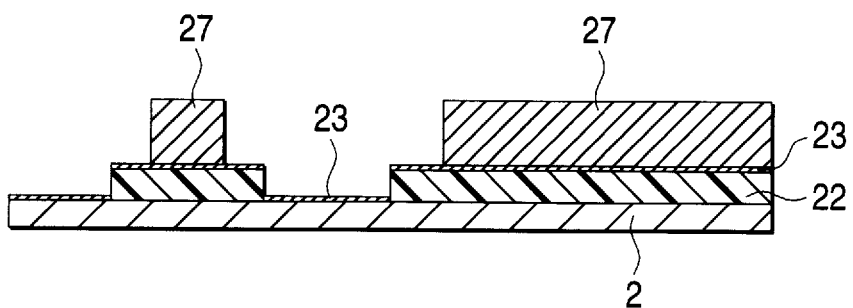
Figure 10:
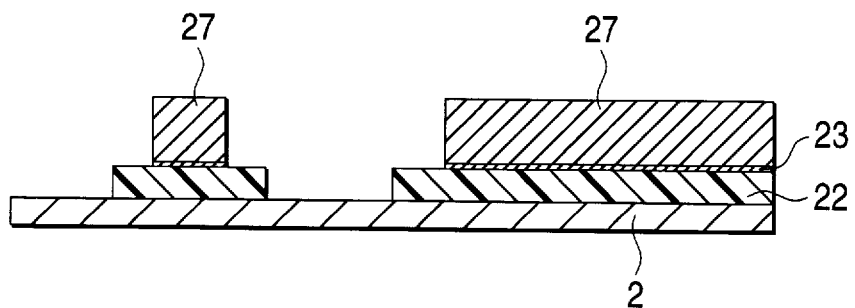
Figure 11:
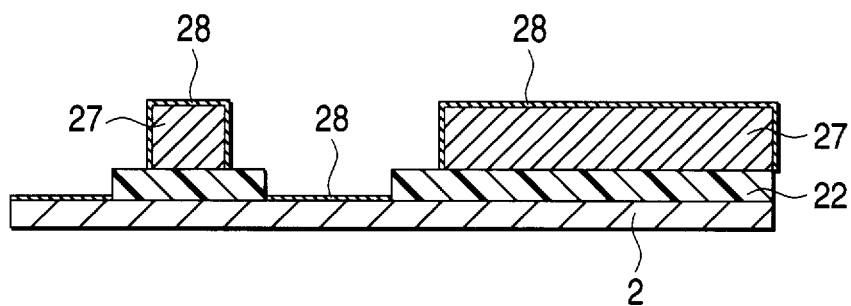

Then, as shown in FIG. 8 and FIG. 9, after carrying out a light-exposure and a developing treatment by a patterning technique using a photoresist 26 or a dry film laminate, the copper conductive layer 25 at the non-pattern portions are removed by etching, whereby a definite conductive pattern 27 comprising the copper is formed on the insulating layer 22 comprising the polyimide resin. In this case, etching of the copper thin layer is preferably carried out by alkali etching.

After removing by etching the copper conductive layer of the non-pattern portions, the chromium thin layer 23 is further removed by etching and a definite conductive pattern 27 is obtained on the insulating layer 22 comprising the polyimide resin as shown in Table 10. For etching the chromium thin layer 23, for example, a potassium ferrycyanide etching solution, a potassium permanganate etching solution, or a sodium metasilicate etching solution is used.

After removing the unnecessary chromium thin layer on the substrate, electroless nickel plating is applied to form a hard nickel thin layer 28 on the surface of the copper conductive layer 27 and the surface of the stainless steel thin substrate 2, whereby the surface of the copper conductive layer is protected. Accordingly, the thickness of nickel plating may be in such a degree that the copper conductive layer as the lower layer does not expose, and is in the range of usually from 0.05 to 0.1 μm.

Thereafter, the conductive pattern 27 of the wiring portions are protected by coating using the photosensitive polyimide resin precursor, and also terminal is formed at each of the necessary terminal-forming portions. The surface is similarly protected by coating leaving the portion to form a cover layer. In FIG. 12 to FIG. 16, the left side of the substrate shows the formation of the wiring portion and the right side thereof shows the formation of the terminal portion.

Figure 12:
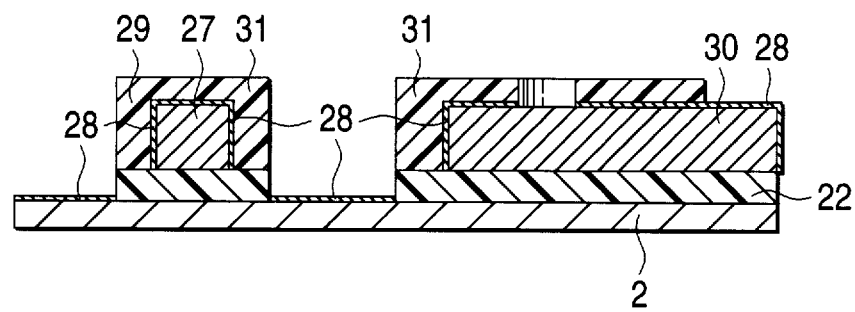

That is, as shown in FIG. 12, in the wiring portion, the conductive pattern 27 is coated with the polyimide resin 29. In the terminal-forming portion, the terminal-forming portion is left by patterning and also leaving a lead portion 30 for forming the terminal by electrolytic plating. Coating, light-exposure, heating after light-exposure, development, and heat-curing (imidation) are carried out using the foregoing photosensitive polyimide resin precursor in the same manner as above to coat with the polyimide resin, whereby a coated layer 31 is formed.

Figure 13:
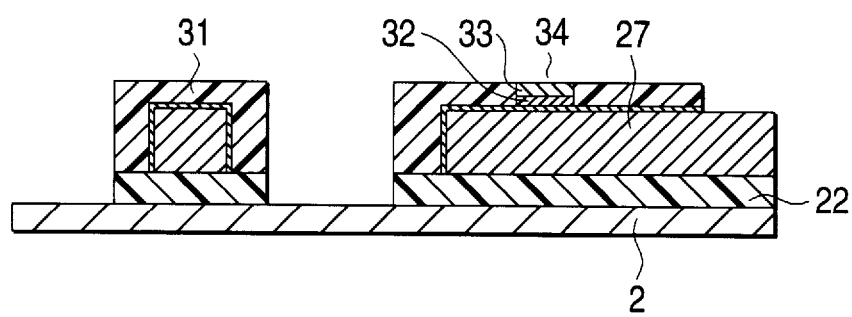

As shown in FIG. 13, in the terminal-forming portion, the electroless nickel plated thin layer 28 (see FIG. 11) which protects the surface of the conductor pattern 27 is released and at the same time, the electroless nickel plated thin layer 28 on the stainless steel foil substrate 2 is also released. After coating the stainless steel foil substrate, the conductor pattern 27, and the polyimide resin coating film 31 with a photoresist leaving the terminal-forming portion by a method of using a photoresist according to a conventional method, electrolytic nickel plating 32 and electrolytic gold plating are successively applied to the terminal-forming portion to form a terminal 34. In this case, the thickness of electrolytic nickel plating and the thickness of electrolytic gold plating both are usually from about 1 to 5 μm. Thereafter, the photoresist is removed.

Figure 14:
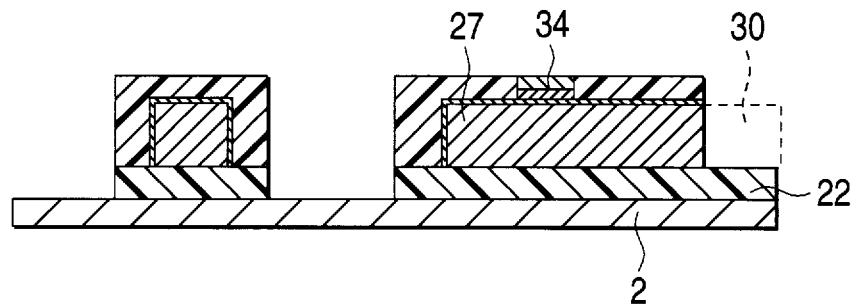

As shown in FIG. 14, in the conductor pattern 27 having formed thereon the terminal 34, the lead portion 30 (see FIG. 12) which is used for electrolytic. plating is removed by chemical etching. The removal of copper and chromium at the lead portion may be performed in the same method as described above.

Figure 15:
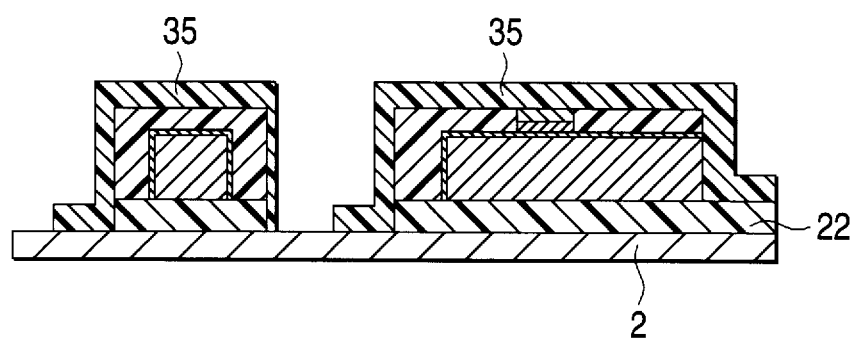
Figure 16:
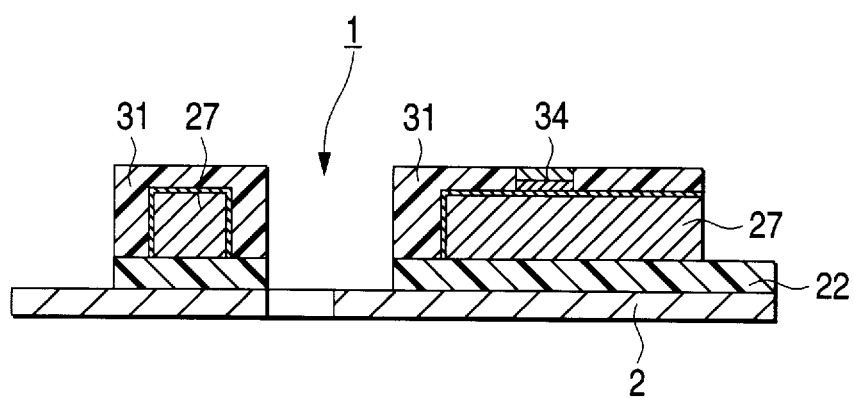

After removing the lead portion, for cutting the stainless steel foil substrate 2 by chemical etching, by carrying out a light exposure and a development using a photoresist 35 or a dry film laminate according to a conventional method, a desired pattern is formed on the stainless steel foil substrate 2 as shown in FIG. 15. The stainless steel foil substrate is then cut into a desired form by etching. In this case, as the etching solution, an aqueous solution of ferric chloride, cupric chloride, etc., is used.

After the etching treatment, by washing with pure water and drying, the circuit-formed suspension substrate 1 of the present invention can be obtained. That is, the circuit-formed suspension substrate has the insulating layer 22 comprising the polyimide resin on the stainless stain foil substrate 2 and has the conductor pattern 27 comprising the thin layer of the conductive layer on the insulating layer, that is, the pattern circuit, and the entire surface thereof is protected by coating with the coating layer 31 comprising the polyimide resin leaving the terminal 34.

As described above, the circuit substrate of the present invention has the polyimide resin layer obtained by the reaction of two kinds of the aromatic diamines at a definite proportion and two kinds of the aromatic tetracarboxylic acid dianhydrides at a definite proportion as the insulating layer on the metal foil substrate, and since the polyimide resin has a low hygroscopic property, the dimensional change and warping by the change of the humidity in the environmental atmosphere are very less.

Accordingly, in the circuit-formed suspension substrate of the present invention, since the polyimide resin has a low hygroscopic property, when magnetic recording and regeneration are carried out in the magnetic disk device such as a hard disk device, etc., an inferior performance does not occur.

The present invention is described in more detail by referring to the following examples, but it should be understood that the invention is not construed as being limited thereto.

EXAMPLE 1

In 11.81 kg of N-methyl-2-pyrrolidone were dissolved 0.949 kg (3.25 mols) of 1,3-bis(4-aminophenoxy)benzene, 0.936 kg (2.92 mols) of 2,2'-bis(trifluoromethyl)-4,4'-diaminobiphenyl, and 0.081 kg (0.33 mol) of bis(aminopropyl)tetramethyldisiloxane (the sum of the diamine components: 6.5 mols) as diamines, and 0.956 kg (3.25 mols) of diphathalic acid dianhydride and 1,443 kg (3.25 mols) of 2,2-bis(3,4-dicarboxyphenyl) hexafluoropropane dihydride (the sum of the tetracarboxylic acid dianhydride components: 6.50 mols) as tetracarboxylic acid dianhydrides. The resulting solution was stirred at room temperature for 24 hours. The temperature of the solution was raised to 75° C. When the viscosity reached 5,000 c.p., heating was stopped, and the solution was allowed to stand to cool it to room temperature. 0.696 kg (1.93 mols) of an N-methyl compound was added to the solution, and a solution of a photosensitive polyimide resin precursor was prepared.

After coating the solution of the photosensitive polyimide resin precursor obtained above on a long stainless steel (SUS 304) foil having a thickness of 25 µm by a continuous coater, the coating layer was dried by heating at 120° C. for 2 minutes to form the coating film of the photosensitive polyimide resin precursor.

After irradiating the coating film with ultraviolet rays via a mask at an exposure amount of 700 mJ/cm² and heating the film at 160° C. for 3 minutes, the coating film was subjected to a development treatment to form negative-type images. Furthermore, by heating the substrate having the negative-type images at 400° C. under a vacuum of 0.01 torr, a patterned insulating layer (thickness 6 µm) comprising the polyimide resin was formed to obtain a circuit substrate.

After allowing to stand the circuit substrate in the atmosphere of a temperature of 85° C. and a relative humidity of 85% for 100 hours, water absorption of the polyamide resin measured by the Kark Fischer's method was 0.5%, and the elongation of the polyimide resin was about 0.1%, which showed substantial no elongation. Thus, before and after the tests, the form of the circuit substrate was scarcely changed and the occurrence of warping was not observed.

On the insulating layer comprising the polyimide resin of the circuit substrate thus obtained were formed the thin layer of chromium having a thickness of 500 Å and the thin layer of copper having a thickness of 1,000 Å by continuous sputtering treatments, respectively. The surface resistance of the copper thin layer formed was from 0.3 to 0.4 Ω/□.

After adhering a lightly pressure-sensitive adhesive sheet to the back surface of the stainless steel substrate as a plating mask, copper sulfate electrolytic plating was applied to the entire surface of the copper thin layer to form a conductive layer comprising a copper plating, having a thickness of 10 µm.

After laminating a commercially available dry film laminate on the conductive layer at 110° C., the laminated layer was light-exposed at an exposure amount of 80 mJ/cm², and developed. The copper conductive layer at the non-pattern portion was removed by alkali etching to pattern the conductive layer while leaving the lead portion for electrolytic plating together with the wiring portion and the terminal-forming portion, and the resist was then removed.

The stainless steel foil substrate thus treated was immersed in an aqueous solution of a mixture of potassium ferricyanide and sodium hydroxide at 25° C. to remove the unnecessary chromium thin layer.

Ordinary electroless nickel plating was applied to the stainless steel foil substrate to form a nickel thin layer having a thickness of about 0.5 µm on the entire surface of the stainless steel foil substrate including the conductive layer and the insulating layer.

A desired coating layer was formed on the wiring portion and the terminal-forming portion of the conductive layer on the stainless steel foil substrate using the photosensitive polyimide resin precursor in the same manner as above.

The substrate was immersed in a solution of a nitric acid releasing agent at room temperature to remove the electroless nickel plated thin layer on the terminal-forming portion and the stainless steel foil substrate.

After coating with an ordinary photoresist leaving the terminal-forming portion according to a conventional method, by successively applying electrolytic nickel plating and electrolytic gold plating to the terminal-forming portion, the plating layers each having a thickness of 1 µm were formed to form a terminal. Thereafter, the photoresist was released.

After the plating treatments, for removing the lead portion used for platings from the conductive layer, copper alkali etching and chromium etching were applied in the same method as above.

After removing the lead portion from the conductive layer as, for cutting the stainless steel foil substrate into each desired form, after carrying out a light-exposure and a development using a photoresist or a dry film laminate according to a conventional method to form each desired pattern, the stainless steel foil substrate was immersed in a ferric chloride etching solution at 45° C. and cut into each desired form. After sufficiently washing the cut substrate with pure water, they were dried to obtain each cut circuit-formed suspension substrate.

From the circuit-formed suspension substrate thus obtained, the polyimide resin film was released to form a sample of the polyimide resin film having a width of 5 mm, a thickness of 6 µm, and a length of 100 mm. After allowing to stand the sample in an atmosphere of a temperature of 85° C. and a relative humidity of 85%, the water absorption measured by a Karl Fischer's method was 0.5%. Since the water absorption was less, the circuit-formed suspension substrate obtained was excellent in the dimensional stability and did not cause warping in spite of change of the humidity in the environmental atmosphere.

EXAMPLE 2

In 11.81 kg of N-methyl-2-pyrrolidone were dissolved 0.949 kg (3.25 mols) of 1,3-bis(4-aminophenoxy)benzene and 1.04 kg (3.25 mols) of 2,2'-bis(trifluoromethyl)-4,4'-diaminophenyl (the sum of the diamine components: 6.50 mols) as diamines and 0.956 kg (3.25 mols) of diphthalic acid dianhydride and 1.443 kg (3.25 mols) of 2,2-bis(3,4-dicarboxyphenyl)hexafluoropropane dianhydride (the sum of the tetracarboxylic acid dianhydride 6.50 mols) as aromatic tetracarboxylic acid dianhydrides, and the resulting solution was stirred at room temperature for 24 hours. The temperature of the solution was raised to 75° C. When the viscosity of the solution reached 5,000 c.p., heating was stopped, and the solution was allowed to stand to cool it to room temperature. By adding 0.696 kg (1.93 mols) of an N-methyl compound to the solution, a solution of a photosensitive polyimide resin precursor was prepared.

After coating the solution of the photosensitive polyimide resin precursor on a long stainless steel (SUS 304) having a thickness of 25 µm by a continuous coater, the coating layer was dried at 120° C. for 2 minutes to form the coating layer of the photosensitive polyimide resin precursor. After irradiating the coating layer with ultraviolet rays via a mask at a light-exposure amount of 700 mJ/cm$^2$ and heating at 160° C. for 3 minutes, the coating layer was developed to form negative-type images. By further heating the coating layer having the negative-type images formed at 400° C. in a vacuum of 0.01 torr, a patterned insulating layer (thickness 6 µm) comprising the polyimide resin was formed to obtain a circuit substrate.

The same procedure as in Example 1 was followed using the circuit substrate, to obtain a circuit-formed suspension substrate. From the circuit-formed suspension substrate thus obtained, the polyimide resin film was released and when the water absorption thereof was measured in the same manner as in Example 1, the water absorption was 0.4%. Since the hygroscopic property of the polyimide resin was less as described above, the circuit-formed suspension substrate of the present invention was excellent in the dimensional stability and did not cause warping in spite of change of the humidity in the environmental atmosphere.

EXAMPLE 3

In 11.81 kg of N-methyl-2-pyrrolidone were dissolved 0.853 kg (2.92 mols) of 1,3-bis(4-aminophenoxy)benzene, 1.04 kg (3.25 mols) of 2,2'-bis(trifluoromethyl)-4,4'-diaminobiphenyl, and 0.081 kg (0.33 mol) of bis(aminopropyl)tetramethyldisiloxane (the sum total of the diamine components: 6.50 mols) as the diamines and 0.956 kg (3.25 mols) of diphathalic acid dianhydride and 1,443 kg (3.25 mols) of 2,2-bis(3,4-dicarboxyphenyl)hexafluoropropane dihydride (the sum of the tetracarboxylic acid dianhydride components: 6.50 mols) as aromatic tetracarboxylic acid dianhydrides. The resulting solution was stirred at room temperature for 24 hours. The temperature of the solution was raised to 75° C., and when the viscosity reached 5,000 c.p., heating was stopped, and the solution was allowed to stand to cool it to room temperature. By adding 0.696 kg (1.93 mols) of an N-methyl compound to the solution, a solution of a photosensitive polyimide resin precursor was prepared.

After coating the solution of the photosensitive polyimide resin precursor obtained above on a long stainless steel (SUS 304) foil having a thickness of 25 µm by a continuous coater, the coating layer was dried by heating at 120° C. for 2 minutes to form the coating layer of the photosensitive polyimide resin precursor.

After irradiating the coating layer with ultraviolet rays via a mask at an exposure amount of 700 mJ/cm$^2$ and heating the layer at 160° C. for 3 minutes, the coating layer was subjected to a development treatment to form negative-type images. By heating the substrate having the negative-type images at 400° C. under a vacuum of 0.01 torr, a patterned insulating layer (thickness 6 µm) comprising the polyimide resin was formed to obtain a circuit substrate.

The same procedure as in Example 1 using was followed the circuit substrate, to obtain a circuit-formed suspension substrate. From the circuit-formed suspension substrate thus obtained, the polyimide resin film was released and when the water absorption thereof was measured in the same manner as in Example 1, the water absorption was 0.3%. Since the hygroscopic property of the polyimide resin was less as described above, the circuit-formed suspension substrate of the present invention was excellent in the dimensional stability and did not cause warping in spite of change of the humidity in the environmental atmosphere.

EXAMPLE 4

In 11.81 kg of N-methyl-2-pyrrolidone were dissolved 0.94 kg (3.25 mols) of 1,3-bis(4-aminophenoxy)benzene, 0.936 kg (2.92 mols) of 2,2'-bis(trifluoromethyl)-4,4'-diaminobiphenyl, and 0.081 kg (0.33 mol) of bis(aminopropyl)tetramethyldisiloxane (the sum of the diamine components: 6.50 mols) as diamines and 0.764 kg (2.60 mols) of diphathalic acid dianhydride and 1,732 kg (3.90 mols) of 2,2-bis(3,4-dicarboxyphenyl)hexafluoropropane dihydride (the sum of the tetracarboxylic acid dianhydride components: 6.50 mols) as aromatic tetracarboxylic acid dianhydrides. The resulting solution was stirred at room temperature for 24 hours. The temperature of the solution was raised to 75° C., and when the viscosity reached 5,000 c.p., heating was stopped, and the solution was allowed to stand to cool it to room temperature. By adding 0.696 kg (1.93 mols) of an N-methyl compound to the solution, a solution of a photosensitive polyimide resin precursor was prepared. After coating the solution of the photosensitive polyimide resin precursor obtained above on a long stainless steel (SUS 304) foil having a thickness of 25 µm by a continuous cater, the coating layer was dried by heating at 120° C. for 2 minutes to form the coating layer of the photosensitive polyimide resin precursor.

After irradiating the coating layer with ultraviolet rays via a mask at an exposure amount of 700 mJ/cm$^2$ and heating the layer at 160° C. for 3 minutes, the coating layer was subjected to a development treatment to form negative-type images. By heating the substrate having the negative-type images at 400° C. under a vacuum of 0.01 torr, a patterned insulating layer (thickness 6 µm) comprising the polyimide resin was formed to obtain a circuit substrate.

The same procedure as in Example 1 was followed using the circuit substrate, to obtain a circuit-formed suspension substrate. From the circuit-formed suspension substrate thus obtained, the polyimide resin film was released, and when the water absorption thereof was measured in the same manner as in Example 1, the water absorption was 0.3%. Since the hygroscopic property of the polyimide resin was less as described above, the circuit-formed suspension substrate of the present invention was excellent in the dimensional stability and did not cause warping in spite of change of the humidity in the environmental atmosphere.

While the invention has been described in detail and with reference to specific embodiments thereof, it will be apparent to one skilled in the art that various changes and modifications can be made therein without departing from the spirit and scope thereof.

What is claimed is:

1. A circuit substrate comprising a metal foil substrate and an insulating layer comprising a polyimide resin formed on the metal foil substrate, wherein said polyimide resin is a polyimide resin obtained by the reaction of (A) aromatic diamines comprising
  (a) 1,3-bis(4-aminophenoxy)benzene and
  (b) 2,2'-bis(trifluoromethyl)-4,4'-diaminobiphenyl
and (B) aromatic tetracarboxylic acid dianhydrides comprising
(a) 3,4,3',4'-biphenyltetracarboxylic acid dianhydride and
(b) 2,2-bis(3,4-dicarboxyphenyl)hexafluoropropane dianhydride.

2. A circuit substrate comprising a metal foil substrate and an insulating layer comprising a polyimide resin formed on the metal foil substrate, wherein said polyimide resin is a polyimide resin obtained by reacting, in the presence of a photosensitive agent, a polyimide precursor obtained from
(A) aromatic diamines comprising
(a) 1,3-bis(4-aminophneoxy)benzene and
(b) 2,2'-bis(trifluoromethyl)-4,4'-diaminobiphenyl and
(B) aromatic tetracarboxylic acid dianhydrides comprising
(a) 3,4,3',4'-biphenyltetracarboxylic acid dianhydride and
(b) 2,2-bis(3,4-dicarboxyphenyl)hexafluoropropane dianhydride.

3. The circuit substrate of claim 2, wherein the photosensitive agent is represented by following formula (I);

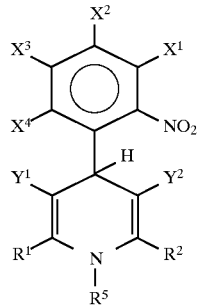

wherein $X^1$, $X^2$, $X^3$, and $X^4$ each independently represent a hydrogen atom, a fluorine atom, a nitro group, a methoxy group, an amino group, a dialkylamino group, a cyano group, or a fluorinated alkyl group; $Y^1$ represents a cyano group or a group represented by a formula —$COR^3$; $Y^2$ represents a cyano group or a group represented by a formula —$COR^4$ (wherein $R^3$ and $R^4$ each independently represent an alkyl group having from 1 to 4 carbon atoms, an alkoxy group, an anilino group, a toluidino group, a benzyloxy group, an amino group, or a dialkylamino group); $R^1$, $R^2$, and $R^3$ each independently represent a hydrogen atom or an alkyl group having from 1 to 3 carbon atoms; and said $R^1$ and $R^3$ and said $R^2$ and $R^4$ each can form a ring capable of forming a 5-membered ring, a 6-membered ring, or a heterocyclic ring each containing a keto group.

4. The circuit substrate of claim 2, wherein the photosensitive agent is at least one dihydropyridine derivative selected from the group consisting of 4-o-nitrophenyl-3,5-dimethoxycarbonyl-2,6-dimethyl-1,4-dihydropyridine, 4-o-nitrophenyl-3,5-diacetyl-1,4-dihydropyridine, and 4-o-nitrophenyl-3,5-dimethoxycarbonyl-2,6-dimethyl-1-methyl-4-hydropyridine.

5. A method of producing a circuit substrate having an insulating layer comprising a polyimide resin by forming a coating film of a photosensitive polyimide resin precursor on a metal foil substrate, light-exposing, heating after the light-exposure, developing, and then imidating the precursor by heating, wherein said photosensitive polyimide resin precursor is obtained by compounding polyamic acid obtained by the reaction of
(A) aromatic diamines comprising
(a) 1,3-bis(4-aminophenoxy)benzene and
(b) 2,2'-bis(trifluoromethyl)-4,4'-diaminobiphenyl and
(B) aromatic tetracarboxylic acid dianhydrides comprising
(a) 3,4,3',4'-biphenyltetracarboxylic acid dianhydride and
(b) 2,2-bis(3,4-dicarboxyphenyl)hexafluoropropane dianhydride with a photosensitive agent.

6. The method of producing a circuit substrate of claim 5, wherein the photosensitive agent is represented by following formula (I);

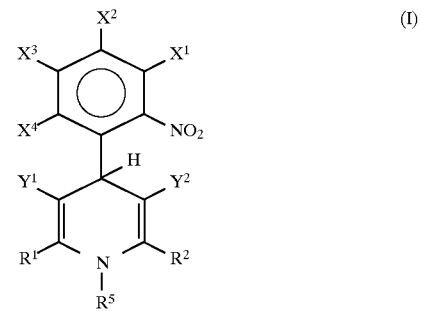

wherein $X^1$, $X^2$, $X^3$, and $X^4$ each independently represent a hydrogen atom, a fluorine atom, a nitro group, a methoxy group, an amino group, a dialkylamino group, a cyano group, or a fluorinated alkyl group; $Y^1$ represents a cyano group or a group represented by a formula —$COR^3$; $Y^2$ represents a cyano group or a group represented by a formula —$COR^4$ (wherein $R^3$ and $R^4$ each independently represent an alkyl group having from 1 to 4 carbon atoms, an alkoxy group, an anilino group, a toluidino group, a benzyloxy group, an amino group, or a dialkylamino group); $R^1$, $R^2$, and $R^3$ each independently represents a hydrogen atom or an alkyl group having from 1 to 3 carbon atoms; and said $R^1$ and $R^3$ and said $R^2$ and $R^4$ each can form a ring capable of forming a 5-membered ring, a 6-membered ring, or a heterocyclic ring each containing a keto group.

7. The method of producing a circuit substrate of claim 5, wherein the photosensitive agent is at least one dihydropyridine derivative selected from the group consisting of 4-o-nitrophenyl-3,5-dimethoxycarbonyl-2,6-dimethyl-1,4-dihydropyridine, 4-o-nitrophenyl-3,5-diacetyl-1,4-dihydropyridine, and 4-o-nitrophenyl-3,5-dimethoxycarbonyl-2,6-dimethyl-1-methyl-4-hydropyridine.

8. A circuit-formed suspension substrate comprising a metal foil substrate, an insulating layer comprising a polyimide resin formed on the metal foil substrate, and a pattern circuit comprising a conductive layer formed on the insulating layer, wherein said polyimide resin is a polyimide resin obtained by the reaction of
(A) aromatic diamines comprising
(a) 1,3-bis(4-aminophenoxy)benzene and
(b) 2,2'-bis(trifluoromethyl)-4,4'-diaminobiphenyl and
(B) aromatic tetracarboxylic acid dianhydrides comprising
(a) 3,4,3',4'-biphenyltetracarboxylic acid dianhydride and
(b) 2,2-bis(3,4-dicarboxyphenyl)hexafluoropropane dianhydride.

9. A circuit-formed suspension substrate comprising a metal foil substrate, an insulating layer comprising a polyimide resin formed on the metal foil substrate, and a pattern circuit comprising a conductive layer formed on the insulating layer, wherein said polyimide resin is a polyimide resin obtained by reacting, in the presence of a photosensitive agent, a polyimide resin precursor obtained from (A) aromatic diamines comprising
  (a) 1,3-bis(4-aminophenoxy)benzene and
  (b) 2,2'-bis(trifluoromethyl)-4,4'-diaminobiphenyl
and
(B) aromatic tetracarboxylic acid dianhydrides comprising
  (a) 3,4,3',4'-biphenyltetracarboxylic acid dianhydride and
  (b) 2,2-bis(3,4-dicarboxyphenyl)hexafluoropropane dianhydride.

10. The circuit-formed suspension substrate of claim 9, wherein the photosensitive agent is represented by following formula (I);

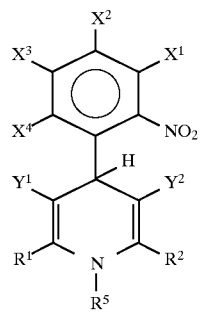

wherein $X^1$, $X^2$, $X^3$, and $X^4$ each independently represents a hydrogen atom, a fluorine atom, a nitro group, a methoxy group, an amino group, a dialkylamino group, a cyano group, or a fluorinated alkyl group; $Y^1$ represents a cyano group or a group represented by a formula —$COR^3$; $Y^2$ represents a cyano group or a group represented by a formula —$COR^4$ (wherein $R^3$ and $R^4$ each independently represent an alkyl group having from 1 to 4 carbon atoms, an alkoxy group, an anilino group, a toluidino group, a benzyloxy group, an amino group, or a dialkylamino group); $R^1$, $R^2$, and $R^3$ each independently represent a hydrogen atom or an alkyl group having from 1 to 3 carbon atoms; and said $R^1$ and $R^3$ and said $R^2$ and $R^4$ each can form a ring capable of forming a 5-membered ring, a 6-membered ring, or a heterocyclic ring each containing a keto group.

11. The circuit-formed suspension substrate of claim 9, wherein the photosensitive agent is at least one dihydropyridine derivative selected from the group consisting of 4-o-nitrophenyl-3,5-dimethoxycarbonyl-2,6-dimethyl-1,4-dihydropyridine, 4-o-nitrophenyl-3,5-diacetyl-1,4-dihydropyridine, and 4-o-nitrophenyl-3,5-dimethoxycarbonyl-2,6-dimethyl-1-methyl-4-hydropyridine.

12. A method of producing a circuit-formed suspension substrate by forming a coating film comprising a photosensitive polyimide resin precursor on a metal foil substrate, light-exposing, heating after the light-exposure, developing, imidating the precursor by heating to form a circuit substrate having an insulating layer comprising a polyimide resin, and then forming a pattern circuit comprising a conductive layer on the insulating layer, wherein said photosensitive polyimide resin precursor is obtained by compounding a polyamic acid obtained by the reaction of (A) aromatic diamines comprising
  (a) 1,3-bis(4-aminophenoxy)benzene and
  (b) 2,2'-bis(trifluoromethyl)-4,4'-diaminobiphenyl
and
(B) aromatic tetracarboxylic acid dianhydrides comprising
  (a) 3,4,3',4'-biphenyltetracarboxylic acid dianhydride and
  (b) 2,2-bis(3,4-dicarboxyphenyl)hexafluoropropane dianhydride with a photosensitive agent.

13. The method of producing a circuit-formed suspension substrate of claim 12, wherein the photosensitive agent is represented by following formula (I);

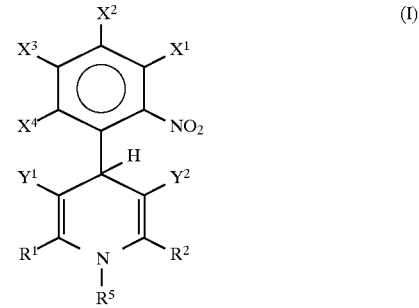

wherein $X^1$, $X^2$, $X^3$, and $X^4$ each independently represents a hydrogen atom, a fluorine atom, a nitro group, a methoxy group, an amino group, a dialkylamino group, a cyano group, or a fluorinated alkyl group; $Y^1$ represents a cyano group or a group represented by a formula —$COR^3$; $Y^2$ represents a cyano group or a group represented by a formula —$COR^4$ (wherein $R^3$ and $R^4$ each independently represent an alkyl group having from 1 to 4 carbon atoms, an alkoxy group, an anilino group, a toluidino group, a benzyloxy group, an amino group, or a dialkylamino group); $R^1$, $R^2$, and $R^3$ each independently represent a hydrogen atom or an alkyl group having from 1 to 3 carbon atoms; and said $R^1$ and $R^3$ and said $R^2$ and $R^4$ each can form a ring capable of forming a 5-membered ring, a 6-membered ring, or a heterocyclic ring each containing a keto group.

14. The method of producing a circuit-formed suspension substrate of claim 12, wherein the photosensitive agent is at least one dihydropyridine derivative selected from the group consisting of 4-o-nitrophenyl-3,5-dimethoxycarbonyl-2,6-dimethyl-1,4-dihydropyridine, 4-o-nitrophenyl-3,5-diacetyl-1,4-dihydropyridine, and 4-o-nitrophenyl-3,5-dimethoxycarbonyl-2,6-dimethyl-1-methyl-4-hydropyridine.

15. The circuit substrate of claim 1, wherein a mol ratio of the components of the aromatic diamines (A) is that the component (a) is from 40 to 60 mol % and the component (b) is from 60 to 40 mol %, and a molar ratio of the components of the aromatic tetracarboxylic acid dianhydrides (B) is that the component (a) is from 40 to 60 mol % and the component (b) is from 60 to 40 mol %.

16. The circuit substrate of claim 2, wherein a molar ratio of the components of the aromatic diamines (A) is that the component (a) is from 40 to 60 mol % and the component (b) is from 60 to 40 mol %, and a molar ratio of the components of the aromatic tetracarboxylic acid dianhydrides (B) is that the component (a) is from 40 to 60 mol % and the component (b) is from 60 to 40 mol %.

17. The circuit-formed suspension substrate of claim 8, wherein a molar ratio of the components of the aromatic diamines (A) is that the component (a) is from 40 to 60 mol % and the component (b) is from 60 to 40 mol %, and a molar ratio of the components of the aromatic tetracarboxylic acid dianhydrides (B) is that the component (a) is from 40 to 60 mol % and the component (b) is from 60 to 40 mol %.

18. The circuit-formed suspension substrate of claim 9, wherein a molar ratio of the components of the aromatic diamines (A) is that the component (a) is from 40 to 60 mol % and the component (b) is from 60 to 40 mol %, and a molar ratio of the components of the aromatic tetracarboxylic acid dianhydrides (B) is that the component (a) is from 40 to 60 mol % and the component (b) is from 60 to 40 mol %.

19. The circuit substrate of claim 15, wherein a polysiloxane represented by following formula (II);

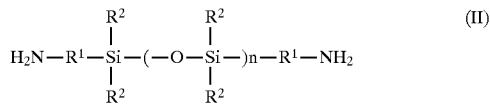

wherein $R^1$ represents an alkylene group having from 1 to 18 carbon atoms; $R^2$ represents an alkyl group having from 1 to 18 carbon atoms; and n represents an integer of from 1 to 100, is used as a part of the aromatic diamines (A) in an amount of 10 mol % or less per mole of the components (A).

20. The circuit substrate of claim 16, wherein a polysiloxane represented by following formula (II);

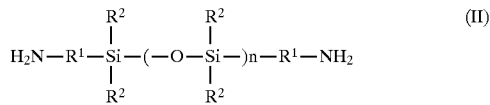

wherein $R^1$ represents an alkylene group having from 1 to 18 carbon atoms; $R^2$ represents an alkyl group having from 1 to 18 carbon atoms; and n represents an integer of from 1 to 100, is used as a part of the aromatic diamines (A) in an amount of 10 mol % or less per mole of the components (A).

21. The circuit-formed suspension substrate of claim 17, wherein a polysiloxane represented by following formula (II);

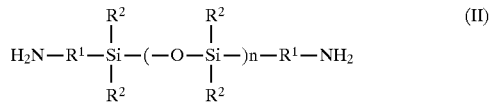

wherein $R^1$ a represents an alkylene group having from 1 to 18 carbon atoms; $R^2$ represents an alkyl group having from 1 to 18 carbon atoms; and n represents an integer of from 1 to 100, is used as a part of the aromatic diamines (A) in an amount of 10 mol % or less per mole of the components (A).

22. The circuit-formed suspension substrate of claim 18, wherein a polysiloxane represented by following formula (II);

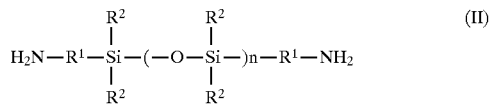

wherein $R^1$ represents an alkylene group having from 1 to 18 carbon atoms; $R^2$ represents an alkyl group having from 1 to 18 carbon atoms; and n represents an integer of from 1 to 100, is used as a part of the aromatic diamines (A) in an amount of 10 mol % or less per mole of the components (A).

* * * * *